(12) United States Patent
So

(10) Patent No.: US 6,246,704 B1
(45) Date of Patent: Jun. 12, 2001

(54) AUTOMATIC ON-CHIP CLOCK TUNING METHODOLOGY AND CIRCUITRY

(75) Inventor: Jason Siucheong So, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/070,046

(22) Filed: Apr. 30, 1998

(51) Int. Cl.[7] ................................................. H04J 3/04
(52) U.S. Cl. ............................................................ 370/532
(58) Field of Search ..................................... 370/532, 537, 370/538, 539, 540, 541

(56) References Cited

U.S. PATENT DOCUMENTS

| | | | | |
|---|---|---|---|---|
| 4,755,704 | * | 7/1988 | Flora et al. ............................ | 327/152 |
| 5,118,975 | * | 6/1992 | Hills et al. ............................ | 327/158 |
| 5,220,581 | * | 6/1993 | Ferraiolo et al. ..................... | 375/226 |
| 5,272,729 | * | 12/1993 | Bechade et al. ..................... | 375/371 |
| 5,349,612 | * | 9/1994 | Guo et al. ............................ | 375/371 |
| 5,488,641 | * | 1/1996 | Ozkan ................................... | 375/374 |
| 5,923,676 | * | 7/1999 | Sunter et al. ........................ | 714/733 |
| 6,084,933 | * | 7/2000 | Kubinec ............................... | 375/362 |

\* cited by examiner

Primary Examiner—David R. Vincent
(74) Attorney, Agent, or Firm—Theordore E. Galanthay; Lisa K. Jorgenson; Renee M. Larson

(57) ABSTRACT

An integrated circuit structure and method is capable of automatically tuning the duty cycle of a generated clock signal to any desired value. Tuning of the duty cycle depends upon the precise layout specifications of multiple delay elements of one or more multiplexing circuits of the integrated circuit device. Connecting one or more multiplexing circuits in a serial fashion allows a base frequency to be multiplied in order to produce a generated clock frequency of a desired frequency. Control of select lines to the multiplexing circuits allows the delay path through the one or more multiplexing circuits to be adjusted, thereby automatically adjusting the duty cycle of the generated clock signal.

20 Claims, 2 Drawing Sheets

AUTOMATIC ON-CHIP CLOCK TUNING METHODOLOGY AND CIRCUITRY

BACKGROUND OF THE INVENTION

The present invention relates generally to integrated circuit devices, and more specifically to a method and layout structure for automatic on-chip clock tuning of an integrated circuit device.

There are many instances in which it is desirable to generate a system clock signal on an integrated circuit device. For instance, given an original frequency provided to the integrated circuit device it may be desirable to generate a system clock signal that is double or quadruple the original frequency. The problem arises in tuning the generated system clock signal to a desired duty cycle. The tuning of the duty cycle is typically achieved in a separate tuning exercise subsequent to the generation of the system clock signal. Such tuning of the duty cycle is time-consuming and must normally be repeated each time the frequency of the system clock signal is changed or generated. It would be advantageous in the art to be able to tune the duty cycle of a system clock signal in such a manner that minimizes time and effort. It would further be advantageous in the art to automatically tune a generated system clock signal to a desired duty cycle.

SUMMARY OF THE INVENTION

It is an object of the present invention to automatically tune the duty cycle of a generated system clock signal to a desired duty cycle.

Therefore, according to the present invention, an integrated circuit structure and method capable of automatically tuning the duty cycle of a generated clock signal to any desired value is presented. The tuning of the duty cycle depends upon the precise layout specifications of multiple delay elements of one or more multiplexing circuits of the integrated circuit device. Connecting one or more multiplexing circuits in a series fashion allows a base frequency to be multiplied in order to produce a generated clock frequency of a desired frequency. Control of select lines to the multiplexing circuits allows the delay path through the one or more multiplexing circuits to be adjusted, thereby automatically adjusting the duty cycle of the generated clock signal.

According to the present invention, a generated clock signal of an integrated circuit device may be automatically tuned to a duty cycle is necessary. A tuning circuit generates one or more select signals that are used to control the duty cycle. The tuning circuit has the following elements: a logic element that performs logic on a high frequency sampling clock signal and a first clock input signal to generate an initial sampling count signal having a pulse width of the first clock signal, a divide counter element that receives and divides the sampling count signal generated by the first logic element by a desired factor to generate a correction signal, and an encoder element that receives the correction signal and generates the one or more select signals. After initial select signals have been generated, the select signals may be adjusted as necessary through a control signal generated from the first clock signal, a second clock signal generated by a first multiplexing circuit and a fourth clock signal generated by a second multiplexing circuit. The control signal is supplied to the logic element of the tuning circuit in lieu of the first clock signal in order to generate a revised correction signal and therefore revised select signals.

A first multiplexing circuit and a second multiplexing circuit, connected in serial fashion, are each provided with the select signals produced by the tuning circuit. The first and second multiplexing circuits each have the same number of serially connected delay elements separated by the same distance from each other and from a multiplexer element. Each delay element is connected to the multiplexer element by a delay path having a delay determined by the predetermined distance between the delay elements. It is important to the proper operation of the invention that the physical layout of the delay elements with regard to each other and the multiplexer element be identical between the first and second multiplexing circuits.

A logic element performs logic on the first clock signal and the second clock output signal of the first multiplexing element to generate the third clock signal. The duty cycle of the third clock signal is automatically changed if necessary by appropriate manipulation of the select signals provided to the first and second multiplexing circuits. A control signal is generated by performing logic on the first, second, and fourth clock signals and this control signal is feed to the logic element of the tuning circuit in lieu of the first clock signals in order to generate a revised sampling control signal. The divide counter element of the tuning circuit receives the revised sampling control signal and generates a revised correction signal. The encoding element in turn generates the revised select signals from the revised correction signal. The revised select signals are supplied to the first and second multiplexing circuit to effect the desired change in the duty cycle of the third clock signal.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention describes an integrated circuit structure and method capable of automatically tuning the duty cycle of a generated clock signal to any desired value. The tuning of the duty cycle depends upon the precise layout specifications of multiple delay elements of one or more multiplexing circuits of the integrated circuit device. Connecting one or more multiplexing circuits in a series fashion allows a base frequency to be multiplied in order to produce a generated clock frequency of a desired frequency. Control of select lines to the multiplexing circuits allows the delay path through the one or more multiplexing circuits to be adjusted, thereby automatically adjusting the duty cycle of the generated clock signal.

Figure 1:
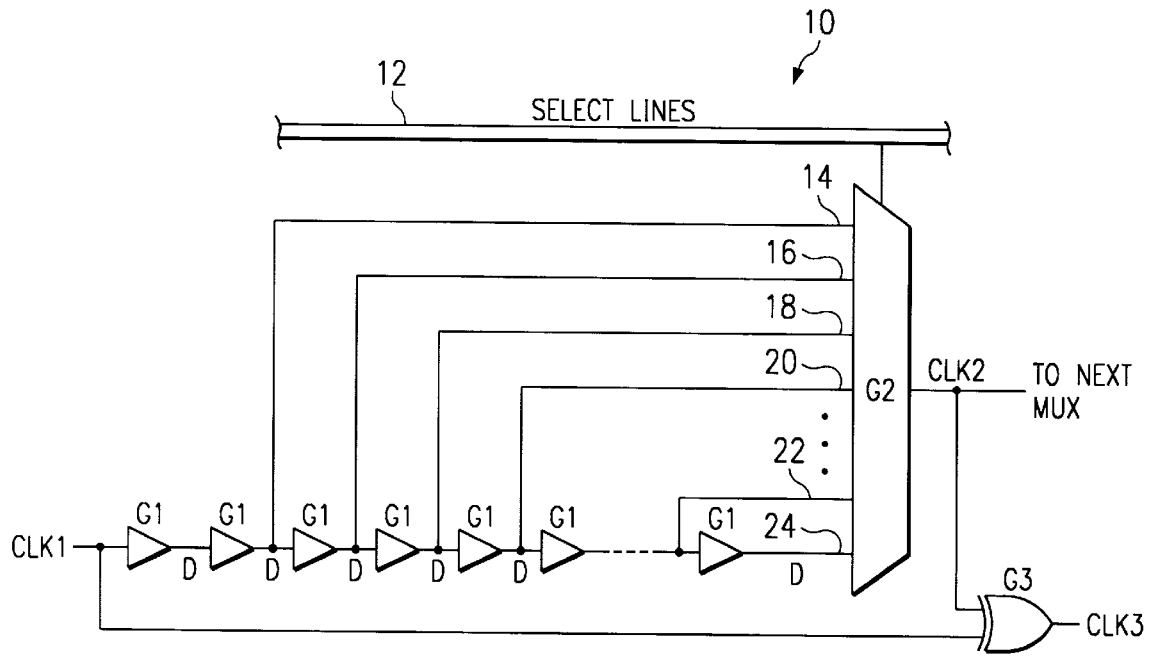
FIG. 1 is a multiplexing circuit, according to the present invention.

Referring to circuitry 10 of FIG. 1, elements g1 represent basic delay element such as inverters or buffers of any kind.

The layout of the circuitry of FIG. 1 is critical to the proper operation of the invention. The placement of the delay elements g1 and their interconnections to the multiple input multiplexer g2 is key. The distance d between each delay element g1 must be identical, resulting in a predictable distance and therefore delay from each delay element g1 to multiple input multiplexer g2. The interconnects between delay elements g1 should be systematic using the same metal layers and the shortest possible regular routings. This control of the circuitry layout will guarantee a systematic incremental delay from one route to the next. It is the systematic incremental delay from delay element g1 to delay element g1 that is used to tune and determine the duty cycle of the generated clock signal.

The select lines 12 are input signals to multiplexer g2 and operate to choose one of the delay paths 14, 16, 18, 20, 22, 24 from all of the inputs to the multiplexer g2. In order to achieve a 50—50 duty cycle, the objective of the selection is to have the delay from clock clk1 to clock clk2 be half of the high or low clock pulse of clock clk1. When clock signals clk1 and clk2 meet together at exclusive OR gate g3, the output signal clock clk3 is a clock signal with twice the frequency of clock clk1. However, the duty cycle may not be 50—50. The duty cycle of clock clk3 is adjusted when select lines 12 select a different route for clock clk1 from routes 14, 16, 18, 20, 22, 24 through multiplexer g2 in order that the delay from clock signal clk1 to clock signal clk2 is equal to half the pulse period of clock clk1. This results in clock signal clk3 being twice the frequency of clock signal clk1.

The number of select lines 12 required depends on the number of delay elements g1 and therefore possible number of routes that clock signal clk1 may take to multiplexer g2. If there are four delay elements g1, for instance, only two select lines are required to offer the four possible combinations, 00, 01, 10, 11, to select one of the four delay paths. If there are eight delay elements g1 then three select lines would be required.

Figure 2:
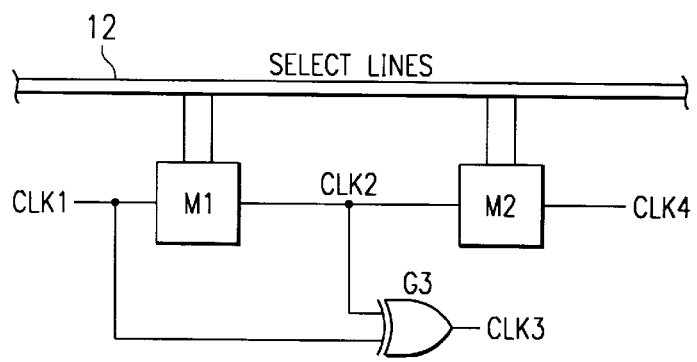
FIG. 2 is a block diagram of a multiplexing system, according to the present invention.

The delay elements g1 and multiplexer g2 of FIG. 1 together comprise multiplexing circuit M. Referring now to FIG. 2, two multiplexing circuits M1 and M2 are shown; thus, the circuitry of FIG. 1 has been duplicated in FIG. 2 with the first multiplexing circuit M1 driving the second multiplexing circuit M2 by clock signal clk2, the output signal of FIG. 1. Again both clock signals clk1 and clk2 are input signals to exclusive OR gate g3. The use of two multiplexing circuits M1 and M2 provides for the frequency of clock signal clk1 to be doubled at clock signal clk3; the duplication of FIG. 2 would quadruple the frequency of clock signal clk1. Again, the layout of the circuitry contained within multiplexing circuits M1 and M2 is critical. They enjoy identical layout placement and interconnection, as described above in conjunction with FIG. 1. Additionally, the selection of delay path in both M1 and M2 is identical at any given time, allowing for the identical delay to be realized in M1 and M2 on all selections of delay paths. This is essential for the automatic detection of the duty cycle. Output clock signal clk4 is used to generate the correction factor as well be described.

Figure 3:
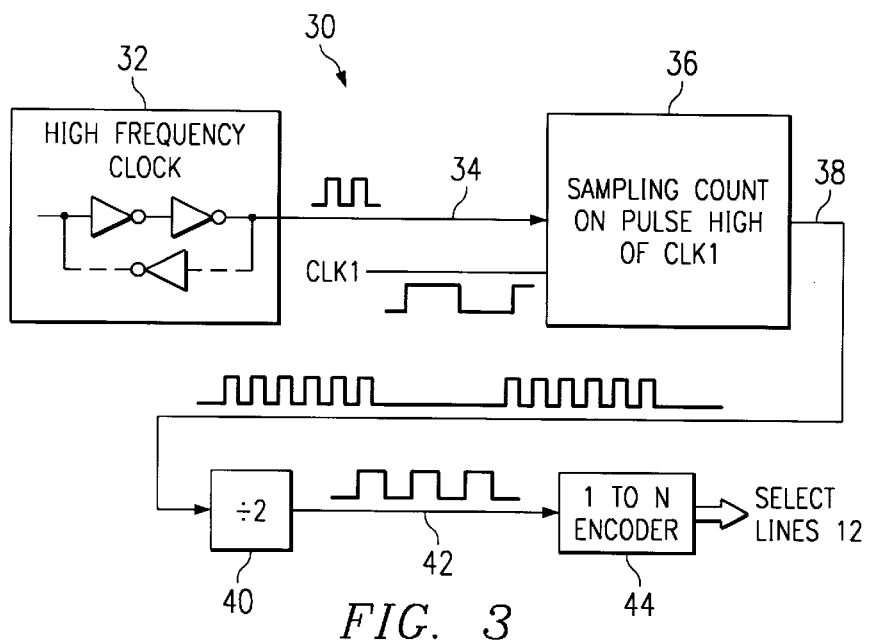
FIG. 3 is a circuit that generates the select lines used to choose a delay path of the multiplexing circuit, according to the present invention.

Circuitry 30 that is capable of generating select lines 12 is shown in FIG. 3. A high frequency sampling clock 34 is generated by block 32; block 32 may comprise a loop of inverters as shown or it may be other means known for generating high frequency clocks. High frequency sampling clock 34 is initially ANDed with clock signal clk1 by block 36 to get a start-up sampling count 38 of the width of the original clock pulse signal of clk1. This sampling count 38 is provided to divide-by-two counter 40 that in turn generates signal 42. Signal 42 is the correction factor that makes adjustment of the duty cycle of clock signal clk3 possible. Signal 42 is provided to encoder block 44 which operates to control the initial selection of the select lines 12 and provides an approximate mid-point 50—50 duty cycle of clock signal clk3.

Figure 4:
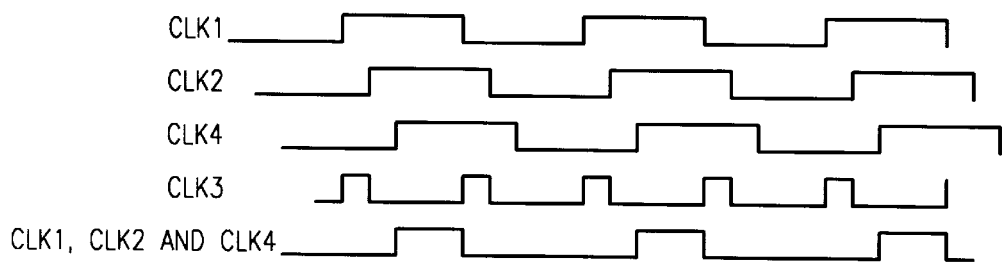
FIG. 4 illustrates waveforms representative of an initial multiplexing delay that is too small, according to the present invention.

There are several possibilities with regard to the accuracy of the approximation of the 50—50 duty cycle. The delay selected through multiplexer M1 may be exactly equal to, less than, or more than half of the pulse width of clock signal clk1. It is unlikely that the delay selected will be exactly correct and therefore some adjustment will need to be made to the duty cycle of clock signal clk3. Referring now to FIG. 4, the waveforms of clock signals clk1, clk2, clk3, and clk4 when the delay selected through M1 is smaller than half of the pulse width of clk1 are illustrated. It can be seen in FIG. 4 that the high pulse of clock signal clk3 is shorter than the low pulse of clk3. By passing clock signals clk1, clk2 and clk4 through AND logic, not shown here, a pulse will be generated, shown as the clk1 AND clk2 AND clk4 waveform, having a pulse width that is twice the correction factor 42 generated in FIG. 3. The generated pulse of clk1 and clk2 and clk4 will be ANDed with sampling clock 34 by block 36 to get a revised signal 38; thus, when the delay selected through M1 is smaller than half of the pulse width of clk1 the generated pulse of clk1 and clk2 and clk4 is provided to the clk1 input to block 36. Signal 38 is counted and divided-by-two using divide-by-two counter 40 to generate the revised correction factor 42. This count 42 is the correction factor that gets decoded by encoder 44 to select lines 12 for delay correction of multiplexer M1, M2.

Figure 5:
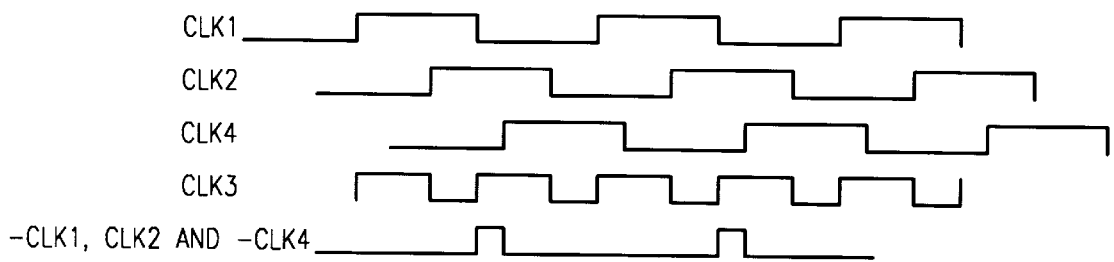
FIG. 5 illustrates waveforms representative of an initial multiplexing delay that is too long, according to the present invention.

The opposite situation, in which the delay selected through M1 is larger than half of the pulse width of clk1, is presented in FIG. 5. FIG. 5 illustrates the waveforms of clock signals clk1, clk2, clk3 and clk4. In this case, the initial delay through multiplexer M1 is too much since it is longer than half of the clk1 pulse. The correction factor 42 is determined in a manner similar to that described above, except that clk1__, clk2 and clk4__are ANDed together to get the waveform illustrated in FIG. 5.

For both situations shown in FIGS. 4 and 5, the falling edge of clock signal clk2 is always used to RESET the count so that the circuitry is reset every cycle of clk2. Additionally, it is recommended that the correction mechanism of the present invention be stopped after an initial period of set-up time to prevent any further correction.

It is noted that the above description of the invention has been couched in terms of tuning the integrated circuit clock signal to a 50—50 duty cycle. It will be appreciated by those of ordinary skill in the art that this particular duty cycle has been described as an example only. Appropriate adjustments to the correction factor 42 will allow any desirable duty cycle to be achieved.

While the invention has been particularly shown and described with reference to a preferred embodiment, it will be understood by those skilled in the art that various changes in form and detail may be made therein without departing from the spirit and scope of the invention.

What is claimed is:

1. A method of selecting a desired delay path of a multiplexing circuit having a predefined delay time, comprising:

arranging a plurality of serially connected delay elements, supplied with a first clock signal, in silicon of an integrated circuit device to define an identical distance between adjacent delay elements of the plurality of delay elements and the identical distance between a last delay element of the plurality of serially connected delay elements and a multiplexer element that is adjacent said last delay element, where said arrangement of the plurality of serially connected delay element defines a plurality of delay paths between said plurality of serially connected delay elements and said multiplexer element having predefined delay times;

supplying the multiplexer element with one or more select signals;

selecting a delay path of said plurality of delay paths according to the one or more select signals; and generating a second clock signal having a delay defined by the selected delay path.

2. The method of claim 1, wherein the second clock signal is generated by the multiplexer element.

3. The method of claim 1, further comprising:

supplying the multiplexer element with revised one or more select signals;

selecting a different delay path of said plurality of delay paths according to the revised one or more select signals; and generating the second clock signal having a delay defined by the different delay path, wherein the delay defined by the different delay path is different from the delay defined by the selected delay path.

4. The method of claim 3, wherein prior to supplying the multiplexer element with the revised one or more select signals, generating the revised one or more select signals, comprising:

generating a control signal by performing a logic operation on the first clock signal, the second clock signal and a correction clock signal;

performing logic on a high frequency sampling clock signal and the control signal to generate a revised sampling count signal;

dividing the revised sampling count signal by a desired factor to generate a revised correction signal; and encoding the revised correction signal to generate the revised one or more select signals.

5. The method of claim 1, wherein before supplying the multiplexer element with the one or more select signals, further comprising:

generating the one or more select signals.

6. The method of claim 5, wherein generating the one or more select signals comprises:

performing logic on a high frequency sampling clock signal and the first clock signal to generate an initial sampling count signal having a pulse width of the first clock signal;

dividing the sampling count signal by a desired factor to generate a correction signal; and encoding the correction signal to generate the one or more select signals.

7. The method of claim 5, wherein after generating the second clock signal having the delay defined by the selected delay path, comprising:

generating a control signal by performing a logic operation on the first clock signal, the second clock signal and a correction clock signal;

performing logic on a high frequency sampling clock signal and the control signal to generate a revised sampling count signal;

dividing the revised sampling count signal by a desired factor to generate a revised correction signal;

encoding the revised correction signal to generate the revised one or more select signals;

supplying the multiplexer with the revised one or more select signals;

selecting a different delay path of said plurality of delay paths according to the revised one or more select signals; and generating the second clock signal having a delay defined by the different delay path, wherein the delay defined by the different delay path is different from the delay defined by the selected delay path.

8. The method of claim 1, further comprising:

supplying the multiplexer with revised one or more select signals;

selecting a different delay path of said plurality of delay paths according to the revised one or more select signals; and generating the second clock signal having a delay defined by the different delay path, wherein the delay defined by the different delay path is different from the delay defined by the selected delay path.

9. The method of claim 8, wherein prior to supplying the multiplexer with the revised one or more select signals, generating the revised one or more select signals, comprising:

generating a control signal by performing a logic operation on the first clock signal, the second clock signal and a correction clock signal;

performing logic on a high frequency sampling clock signal and the control signal to generate a revised sampling count signal;

dividing the revised sampling count signal by a desired factor to generate a revised correction signal; and encoding the revised correction signal to generate the revised one or more select signals.

10. A method for automatically tuning a duty cycle of a generated clock of an integrated circuit device, comprising:

arranging a first plurality of serially connected delay elements, supplied with a first clock signal, in silicon of an integrated circuit device to define an identical distance between adjacent delay elements of the first plurality of delay elements and the identical distance between a last delay element of the first plurality of serially connected delay elements and a first multiplexer element that is adjacent said last delay element of the first plurality of serially connected delay elements, where said arrangement of the first plurality of serially connected delay elements defines a first plurality of delay paths between said first plurality of serially connected delay elements and said first multiplexer element having predefined delay times;

arranging a second plurality of serially connected delay elements, supplied with a second clock signal generated by the first multiplexer element, in silicon of the integrated circuit device to define the identical distance between adjacent delay elements of the second plurality of delay elements and the identical distance between a last delay element o the second plurality of serially connected delay elements and a second multiplexer element that is adjacent said last delay element of the second plurality of serially connected delay elements, where said arrangement of the second plurality of serially connected delay elements defines a second plurality of delay paths between said second plurality of serially connected delay elements and said second multiplexer element having predefined delay times;

generating one or more select signals;
supplying the first plurality of serially connected delay elements and the second plurality of serially connected delay elements with the one or more select signals;
selecting a first delay path of said first plurality of delay paths and a second delay path of said second plurality of delay paths according to the one or more select signals, wherein the first delay path and the second delay path have the same delay; generating the second clock signal having a delay defined by the first delay path;
generating a third clock signal having a duty cycle determined by the first delay path selected according to the one or more select signals;
generating a fourth clock signal having a delay defined by the second delay path; and
tuning the duty cycle of the third clock signal by generating revised one or more select signals.

11. The method of claim 10, wherein generating the one or more select signals comprises:
performing logic on a high frequency sampling clock signal and the first clock signal to generate an initial sampling count signal having a pulse width of the first clock signal;
dividing the sampling count signal by a desired factor to generate a correction signal; and
encoding the correction signal to generate the one or more select signals.

12. The method of claim 10, wherein the second clock signal is generated by the first multiplexer element.

13. The method of claim 10, wherein generating the third clock signal is accomplished by performing a logic operation on the first clock signal and the second clock signal.

14. The method of claim 10, wherein the fourth clock signal is generated by the second multiplexer element.

15. The method of claim 10, wherein tuning the duty cycle of the third clock signal comprises:
generating a control signal by performing a logic operation on the first clock signal, the second clock signal and a fourth clock signal;
performing logic on a high frequency sampling clock signal and the control signal to generate a revised sampling count signal;
dividing the revised sampling count signal by a desired factor to generate a revised correction signal;
encoding the revised correction signal to generate the revised one or more select signals;
supplying the first multiplexer element and the second multiplexer element with the revised one or more select signals;
selecting a different delay path of said first plurality of delay paths according to the revised one or more select signals; and
generating the second clock signal having a delay defined by the different delay path, wherein the delay defined by the different delay path is different from the delay defined by the selected delay path of said first plurality of delay paths.

16. A multiplexing circuit comprising:
a plurality of serially connected delay elements supplied with a first clock signal, wherein according to the layout of the plurality of delay elements in silicon of the integrated circuit device an identical distance between adjacent delay elements of the plurality of delay elements is defined;
a multiplexer element, wherein a last delay element of the plurality of serially connected delay elements that is adjacent to the multiplexer element is separated from the multiplexer element by the identical distance; and
a plurality of delay paths, wherein each delay path of the plurality of delay paths connects a delay element of the plurality of delay elements to the multiplexer element and a delay of each delay path is defined according to the identical distance between adjacent delay elements,
wherein the multiplexer element receives the one or more select signals, selects a delay path of the plurality of delay paths according to the one or more select signals, and generates a second clock signal having the delay of the delay path indicated by the one or more select signals.

17. The multiplexing circuit of claim 16, wherein the multiplexer element selects a different delay path if the one or more select signals are changed.

18. The multiplexing circuit of claim 16, wherein the one or more select signals are generated by a tuning circuit comprising:
a logic element that performs logic on a high frequency sampling clock signal and the first clock signal to generate an initial sampling count signal having a pulse width of the first clock signal;
a divide counter element that receives and divides the sampling count signal generated by the logic element by a desired factor to generate a correction signal; and
an encoder element that receives the correction signal and generates the one or more select signals.

19. A structure of an integrated circuit device that allows a generated clock to be automatically tuned to a duty cycle, comprising:
a tuning circuit that generates one or more select signals, comprising:
a first logic element that performs logic on a high frequency sampling clock signal and a first clock signal to generate an initial sampling count signal having a pulse width of the first clock signal;
a divide counter element that receives and divides the sampling count signal generated by the first logic element by a desired factor to generate a correction signal; and
an encoder element that receives the correction signal and generates the one or more select signals;
a first multiplexing circuit comprising:
a first plurality of serially connected delay elements supplied with the first clock signal, wherein according to the layout of the first plurality of delay elements in silicon of the integrated circuit device an identical distance between adjacent delay elements of the first plurality of delay elements is defined;
a first multiplexer element, wherein a last delay element of the first plurality of serially connected delay elements that is adjacent to the first multiplexer element is separated from the first multiplexer element by the identical distance; and
a first plurality of delay paths, wherein each delay path of the first plurality of delay paths connects a delay element of the first plurality of delay elements to the first multiplexer element and a delay of each delay path is defined according to the identical distance between adjacent delay elements,
wherein the first multiplexer element receives the one or more select signals generated by the tuning circuit, selects a first delay path of the first plurality of delay paths according to the one or more select signals, and generates a second clock signal having the delay of the first delay path indicated by the one or more select signals.

a second logic element that receives the first clock signal and the second clock signal and generates a third clock signal having a duty cycle defined by the delay of the first delay path selected by the first multiplexer according to the one or more select signals;

a second multiplexing circuit comprising:

a second plurality of serially connected delay elements equivalent to the first plurality of delay elements that is supplied with the second clock signal generated by the first multiplexer element, wherein the second plurality of delay elements has the same number of delay elements as the first plurality of delay elements and wherein according to the layout of the second plurality of delay elements in silicon of the integrated circuit device the distance between adjacent delay elements of the second plurality of delay elements is equal to the identical distance between adjacent elements of the first plurality of delay elements;

a second multiplexer element, wherein a last delay element of the second plurality of serially connected delay elements that is adjacent to the second multiplexer element is separated from the second multiplexer element by the identical distance; and a second plurality of delay paths equivalent to the first plurality of delay paths, wherein each delay path of second plurality of delay paths connects a delay element of the second plurality of delay paths to the second multiplexer element and a delay of each delay path is defined according to the identical distance between adjacent delay elements, wherein the second multiplexer element receives the one or more select signals generated by the tuning circuit, selects a second delay path of the second plurality of delay paths according to the one or more select signals, and generates a fourth clock signal having the delay of the second delay path indicated by the one or more select signals, wherein the delay of the first delay path is equal to the delay of the second delay path, wherein when the duty cycle of the third clock signal is not a desired duty cycle, the duty cycle of the third clock signal is automatically adjusted to the desired duty cycle by generating a control signal that is generated by performing a logic operation on the first clock signal, the second clock signal and the fourth clock signal, providing the control signal to the first logic element in place of the first clock signal to generate a revised sampling count signal, providing the revised sampling count signal to the divide counter element to generate a revised correction signal, and providing the revised correction signal to the encoder element that generates a revised one or more select signals that is received by the first multiplexing circuit.

20. The structure of claim 19, wherein the second logic element performs an AND operation to generate the third clock signal.

* * * * *